United States Patent [19]
Kennard

[11] Patent Number: 5,935,874
[45] Date of Patent: Aug. 10, 1999

[54] TECHNIQUES FOR FORMING TRENCHES IN A SILICON LAYER OF A SUBSTRATE IN A HIGH DENSITY PLASMA PROCESSING SYSTEM

[75] Inventor: Mark A. Kennard, Pleasanton, Calif.

[73] Assignee: Lam Research Corporation, Fremont, Calif.

[21] Appl. No.: 09/052,997

[22] Filed: Mar. 31, 1998

[51] Int. Cl.$^6$ .................................................. H01H 1/00
[52] U.S. Cl. ........................ 438/710; 438/714; 438/719
[58] Field of Search .................................. 438/710, 714, 438/719

[56] References Cited

U.S. PATENT DOCUMENTS

| | | | |
|---|---|---|---|
| 5,182,234 | 1/1993 | Meyer ..................................... | 438/710 |
| 5,277,752 | 1/1994 | Aydil et al. ............................. | 438/710 |
| 5,605,603 | 2/1997 | Grimard et al. ......................... | 438/710 |
| 5,783,492 | 3/1995 | Higuchi et al. ......................... | 438/710 |

OTHER PUBLICATIONS

Rob Legtenberg et al., "Anisotropic Reactive Ion Etching of Silicon Using $SF_6/O_2/CHF_3$ Gas Mixtures," Jun. 1995, J. Electrochem Soc. vol. 142, No. 6, pp. 2020–2027.

K.P. Muller et al., "Trench Storage Node Technology for Gigabit DRAM Generations," IBM Advanced Semiconductor Technology Center, Q–7803–393–Apr. 1996, 4 pages.
Tsengyou Syau et al., "Gas Mixtures," Oct. 1991, J. Electrochem. Soc. vol. 138, No. 10, pp. 3076–3081.
W.H. Juan et al., "High–aspect–ratio Si Etching for Microsensor Fabrication," May/Jun. 1995, J. Vac.Sci.Technol.A 13(3), pp. 834–838.

Primary Examiner—Benjamin Utech
Assistant Examiner—Kin-Chan Chen
Attorney, Agent, or Firm—Beyer & Weaver LLP

[57] ABSTRACT

A method for etching a trench in a monocrystal silicon layer. The method includes providing a plasma processing system having a plasma processing chamber. The plasma processing system has a variable plasma generation source and a variable ion energy source with the variable plasma generation source being configured to be controlled independently of the variable ion energy source. The method further includes flowing an etchant source gas that includes $O_2$, helium, and at least one of $SF_6$ and $NF_3$ into the plasma processing chamber. There is also included energizing both the variable plasma generation source and the variable ion energy source to form a plasma from the etchant source gas. Additionally, there is included employing the plasma to etch the trench.

18 Claims, 4 Drawing Sheets

TECHNIQUES FOR FORMING TRENCHES IN A SILICON LAYER OF A SUBSTRATE IN A HIGH DENSITY PLASMA PROCESSING SYSTEM

BACKGROUND OF THE INVENTION

The present invention relates to the fabrication of semiconductor-based devices. More particularly, the present invention relates to improved techniques for forming a trench in a silicon layer of a substrate in a plasma processing chamber having independent plasma generation source and ion energy source.

In the fabrication of semiconductor-based devices (e.g., integrated circuits or flat panel displays), trenches may sometimes be formed in a silicon layer of a substrate (e.g., a silicon wafer or a glass panel). It is known that such trenches may be etched in a plasma processing chamber wherein a plasma that is capable of etching the silicon material through openings in a mask (e.g., of photoresist or hard mask) is utilized.

To facilitate discussion, FIG. 1 depicts a simplified layer stack 100, including a mask layer 102 disposed over a silicon layer 104. Mask layer 102 may represent any suitable mask layer such as photoresist or hard mask (e.g., $SiO_2$, $Si_3N_4$, $Si_xN_y$, Oxynitride, and the like). Silicon layer 104 represents a monocrystal silicon layer of the substrate and may represent the substrate itself (e.g., the semiconductor wafer or the glass panel). To simplify discussion, only some exemplary layers are shown. As is well known, other layers (including, for example, an adhesion layer, seed layer, antireflective coating layer, or another layer) may also be disposed above, below, or in between the shown layers.

In mask layer 102, an exemplary opening 106 is shown through which the etching plasma may enter to remove material of silicon layer 104 to form the desired trench. Note that the term "trench" as employed herein also encompasses other structures etched in the silicon layer such as contact holes, vias, and the like. In the prior art, there is employed a plasma etching process that utilizes a fluorocarbon-based etchant source gas for the trench etch. For relatively low density devices and trenches with relatively low aspect ratios, the fluorocarbon-based plasma etching technique works adequately. However, as the density of semiconductor devices increases on the substrate and/or the aspect ratio of trenches increases, the fluorocarbon-based plasma etching technique has certain limitations.

By way of example, fluorocarbon-based plasma etching tends to result in a fairly low etch rate, which disadvantageously reduces the through put of substrates through the plasma processing chamber. As such, it is a more expensive etch process since fewer substrates can be processed per given unit of time. More importantly, the fluorocarbon-based plasma etching technique is typically regarded as a fairly "dirty" process, i.e., it tends to create particulate contaminants that accumulate on inner surfaces of the plasma processing chamber. Unless the plasma processing chamber is cleaned frequently, the accumulated particulate contaminants may flake off onto the substrate being processed, leading to defects and reducing yield. Generally speaking, the plasma processing chamber employed for the fluorocarbon-based etching needs to be cleaned after 10 to 20 wafers are processed to ensure that the level of particulate contaminant remain acceptably low.

An alternative chemistry for use in etching trenches in the silicon layer is $SF_6/O_2$. As a point of clarification, medium density or low density plasma processing systems, as those terms are employed herein, refer to plasma processing systems wherein the plasma density generated is lower than about $10^{11}$ ions per $cm^3$.

In high density plasma processing chambers (i.e., those producing plasma having a plasma density greater than about $10^{12}$ ions per $cm^3$), the use of $SF_6/O_2$ chemistry is observed to produce commercially unacceptable etch results for the aforementioned high density device and/or high aspect ratio trench etches. For the etch result to be commercial acceptable, criteria pertaining to etch profile, etch rate, mask selectivity, ARDE (Aspects Ratio Dependent Etching, which refers to the disparity in etch rates among features having different feature sizes) or the like, must be met for the design rule being employed. Commercially acceptable etch results are important since they render a given etch process useable in the production of semiconductor products, versus merely possible as an academic exercise and lacking in some etch criteria which renders a process impractical for production usage.

To facilitate discussion, FIG. 2 depicts a trench 202 that has been etched in silicon layer 104 using $SF_6/O_2$ as the etchant source gas in a high density, inductively coupled plasma processing chamber. As shown in FIG. 2, mask undercutting occurs in region 204 due to the high degree of lateral etching near the opening of trench 202. Further down, some roughness on the trench inner surface is observed. It is speculated that the roughness in region 206 may be due, in part, to insufficient passivation at these regions.

More significantly, it is observed that the ARDE (Aspect Ratio Dependent Etching) is particularly severe on the substrate. By way of example, a comparison between the etch rate in 0.8 micron trenches with the etch rate in 1.5 micron trenches reveals that the ARDE is nearly 100 percent in one case (i.e., the etch rate in the 1.5 micron trenches is about twice as fast as the etch rate in the 0.8 micron trenches). The high degree of ARDE results in poor etching results in some trenches on the substrate, rendering the $SF_6/O_2$ chemistry-based etching technique unacceptable for use in high density/inductively coupled plasma processing chambers.

In view of the foregoing, there are desired improved techniques for etching, using high density plasma processing chambers, trenches in a silicon layer of a substrate.

SUMMARY OF THE INVENTION

The present invention relates, in one embodiment, to a method for etching a trench in a monocrystal silicon layer. The method includes providing a plasma processing system having a plasma processing chamber. The plasma processing system has a variable plasma generation source and a variable ion energy source with the variable plasma generation source being configured to be controlled independently of the variable ion energy source. The method further includes flowing an etchant source gas that includes O2, helium, and at least one of SF6 and NF3 into the plasma processing chamber. There is also included energizing both the variable plasma generation source and the variable ion energy source to form a plasma from the etchant source gas. Additionally, there is included employing the plasma to etch the trench.

In another embodiment, the invention relates to a method for etching a trench in a silicon layer. The method includes providing a plasma processing system having a plasma processing chamber. The plasma processing system has a variable plasma generation source and a variable ion energy source with the variable plasma generation source being configured to be controlled independently of the variable ion energy source. There is included flowing an etchant source gas that includes O2, helium, and SF6 into the plasma processing chamber, wherein a flow rate of the helium is greater than about 65% of a total flow rate of the etchant source gas. There is also included energizing both the variable plasma generation source and the variable ion energy source to form a plasma from the etchant source gas and employing the plasma to etch the trench.

These and other advantages of the present invention will become apparent upon reading the following detailed descriptions and studying the various figures of the drawings.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
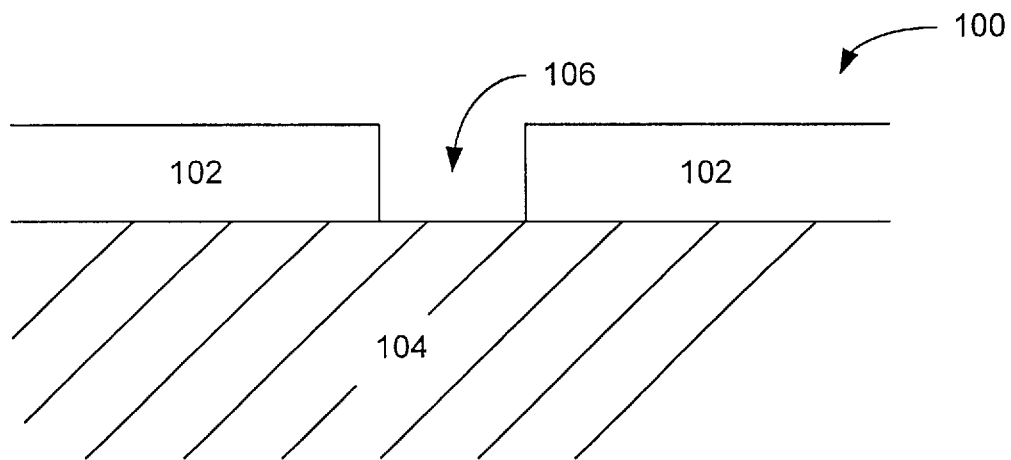
FIG. 1 depicts, to facilitate discussion, a simplified layer stack, including a silicon layer and a mask layer employed for etching a trench in the silicon layer.
Figure 2:
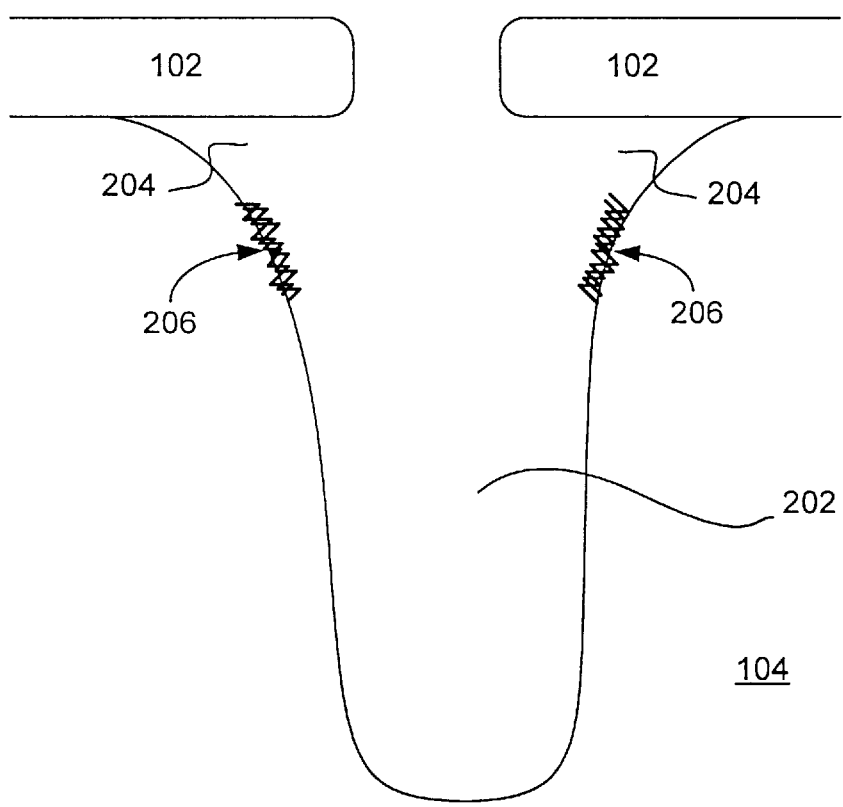
FIG. 2 depicts a trench that has been etched in silicon layer using $SF_6/O_2$ as the etchant source gas in a high density, inductively coupled plasma processing chamber.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one aspect of the present invention, helium is added at a relatively high flow rate to a carbonless, oxygen/fluorine-based chemistry to enable trench etching in a high density plasma chamber. In particular, a relatively high flow of helium (e.g., greater than about 65 percent of the total flow volume) is added to the $O_2/SF_6$ (or $NF_3$) chemistry to enable trench etching in a high density plasma chamber.

Preferably, the high helium flow, oxygen/fluorine-based chemistry is employed in a high density plasma processing chamber that has the capability of controlling the plasma source and the ion energy source separately. When so employed, it is observed that masked selectivity, ARDE, etch rate, and particulate contamination is substantially improved compared to prior art etch techniques that employ the fluorocarbon-based chemistry or the $SF_6/O_2$ (without the high flow of helium).

While not wishing to be bound by theory, it is believed that the addition of a relatively high flow volume of helium improves the directionality of the etch by increasing the ion energy, thereby increasing the vertical etch rate into the trench as well as reducing mask undercutting. It is believed that the addition of the high flow of helium substantially increases the ion energy of the plasma since the ionization energy of helium itself is typically much higher than the ionization energy of either the $SF_6$ or the $O_2$. When a large volume of helium is added (e.g., greater than about 65 percent of the total volume flow), the available $SF_6$ and $O_2$ are substantially all ionized in the chamber before helium becomes ionized Without a generation of additional electrons and ions, the potentials at the electrodes are elevated, which increases the peak-to-peak voltage as well as the ion energy of the plasma within the plasma processing chamber. The higher ion energy of the plasma due to the high flow of helium acts in concert with the ion energy supplied by the bias power of the plasma processing system to improve the directionality of the etch.

As mentioned, it is preferable to employ the invention in a high density plasma processing chamber wherein the plasma generation source and the ion energy source can be independently controlled. The ability to independently control the ion energy supply source allows the etch process to be optimized independent of the ion density to accommodate the increased ion energy of the plasma (which is contributed in part by the high flow of helium).

Without the use of the high flow of helium disclosed herein, the $SF_6/O_2$ chemistry has been shown to produce commercially unacceptable etch results when employed in a low density plasma processing system. By way of example, Legtenberg and Sayau reported gross mask undercut, negatively sloped profile, micromasking, low etch rate, undesirable trench shape or any combination of the above. See, for example, *Anisotropic Reactive Ion Etching of Silicon Using $SF_6/O_2/CHF_3$*, R. 20 Legtenberg, H. Jansen, M. de Boer, M. Elwenspoek, J. Electrochem. Soc. Vol. 142., No. 6, (1995) and *Reactive Ion Etching of Silicon Trenches Using $SF_6/O_2$ Gas Mixtures*, T. Syau, B. Baliga, R. Hamaker, J. Electrochem. Soc. Vol. 138, No. 10, (1991).

Figure 3:
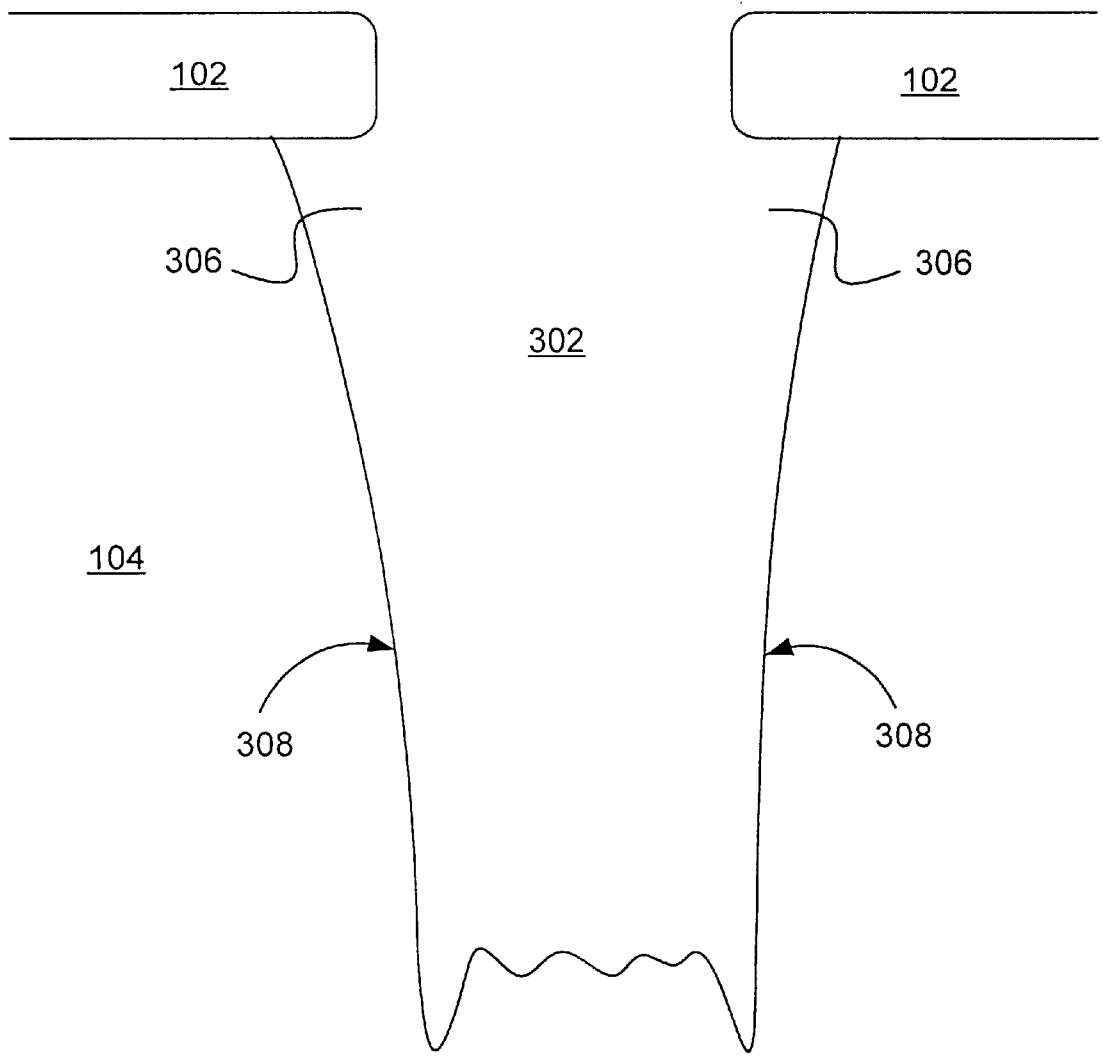
FIG. 3 depicts a trench that has been etched in silicon layer through openings in the hard mask layer in a low density, parallel plate-type plasma processing system.

Surprisingly, the addition of helium to the $O_2/SF_6$ chemistry, even at a relatively high flow rate, does not yield the desirable etch results when employed in a low density plasma processing system. To facilitate discussion, FIG. 3 depicts a trench 302 which is etched in silicon layer 104 through openings in hard mask layer 304 in a low density, parallel plate-type plasma processing system. In the example of FIG. 3, the ion energy in the plasma processing chamber during etching is roughly $10^{10}$ to $10^{11}$ ions per $cm^3$. As shown in FIG. 3, as the helium/$O_2$/$SF_6$ is attempted in a low density, parallel plate-type plasma processing system, severe mask undercutting is observed in region 306. Also, the etch profile is characterized by the sloping sidewall 308, which results in an unacceptable trench shape. Also, there appears to be severe roughness at the bottom of trench 302 with microtrenches observed in the corner region between sloping sidewall 308 and the bottom of the trench. For reasons not completely understood to the inventors herein, the high helium flow, oxygen/fluorine-based chemistry appears to produce commercially acceptable etch results only in high density plasma processing system, and preferably in high density plasma processing system wherein there are independent controls of the plasma generation source and the ion energy source.

Equally surprisingly, when another inert gas is substituted for helium, the etch result degrades. It is believed, therefore, that the specific ionization energy of helium, in combination with its diluting effect and the use of a high density plasma processing system, is critical in producing commercially acceptable etch results while etching trenches in high density plasma processing chambers.

It is contemplated that the improved trench etch technique of the present invention may be practiced in any suitable high density plasma processing system (i.e., those having ion density of greater than about $10^{12}$ ions per cm$^3$), including those adapted for dry etching, plasma etching, reactive ion etching (RIE), magnetically enhanced reactive ion etching (MERIE), or the like. This is true irrespective whether energy to the plasma is delivered through electron cyclotron resonance (ECR) sources, microwave plasma sources, through inductively coupled RF sources such as helicon, helical resonators, and induction coils (whether or not planar). ECR and TCP-brand (transformer coupled plasma) plasma processing systems, among others, are available from Lam Research Corporation of Fremont, Calif. As mentioned, it is preferable that the invention be practiced in a plasma processing system that permits control of the plasma generation source independent of the ion energy source.

Figure 4:
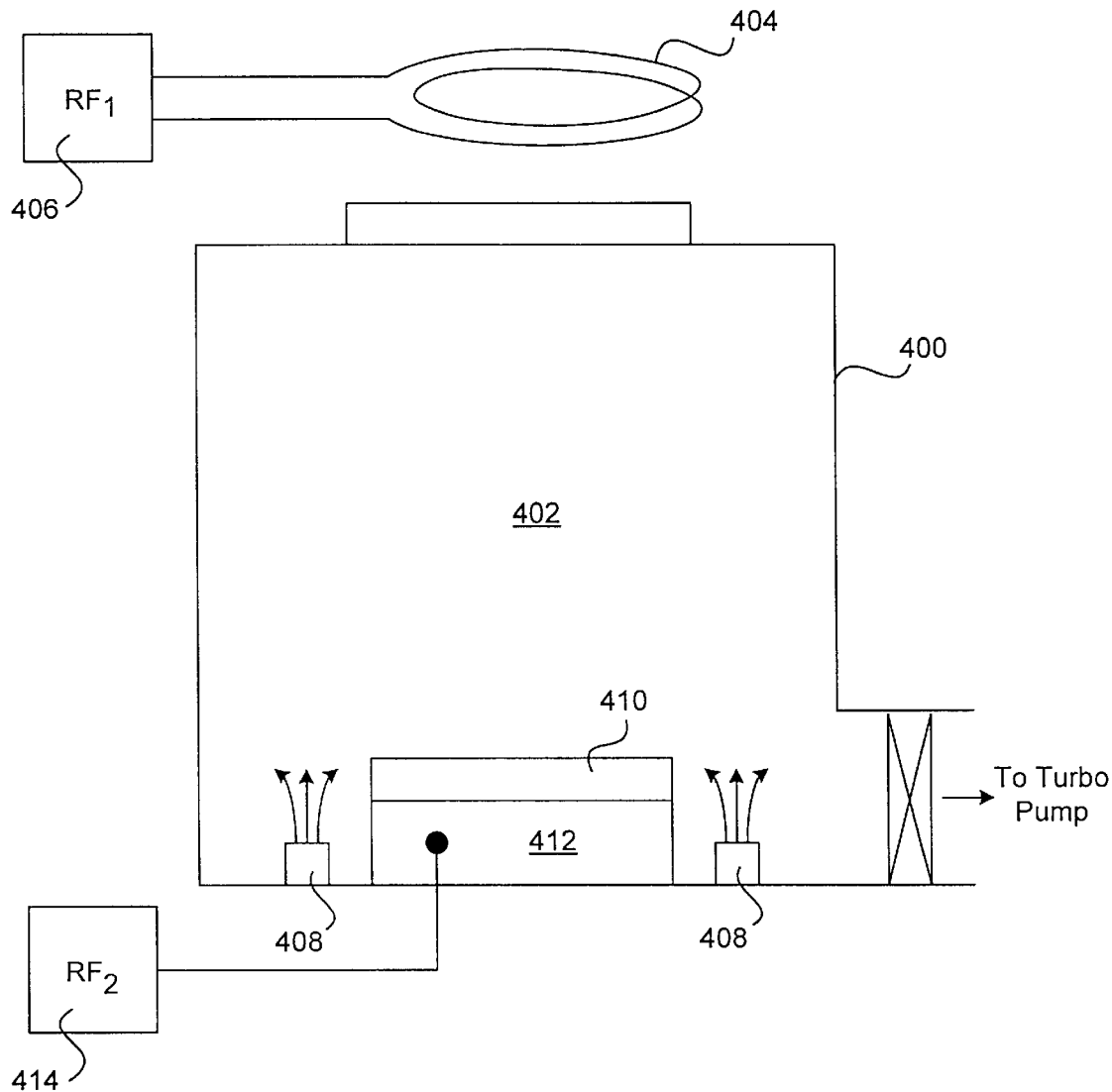
FIG. 4 illustrates a simplified schematic of the TCPTM 9400 SE plasma reactor, representing a plasma processing chamber suitable for use with the present invention.

In one embodiment, the present invention is practiced in a TCP™ 9400 SE low pressure, high density plasma reactor, which is available from Lam Research Corporation, although, as mentioned above, any other conventional and suitable plasma processing systems may well be employed. FIG. 4 illustrates a simplified schematic of the TCP™ 9400 plasma reactor 400, including a plasma processing chamber 402. Above chamber 402, there is disposed an electrode 404, which is implemented by an induction coil in the example of FIG. 4. Coil 404 represents the plasma generation source and is energized by a RF generator 406 via a matching network (not shown in FIG. 4). The RF power supplied to coil 404 may have an RF frequency of, for example, 13.56 MHz.

Within chamber 402, there is provided a gas distribution plate 408, which preferably includes a plurality of holes for distributing gaseous source materials, e.g., the etchant source gases, into the RF-induced plasma region between itself and a substrate 410. The gaseous source materials may also be released from ports built into the walls of the chamber itself or from another gas distribution arrangement such as a shower head arrangement above the substrate. Substrate 410 is introduced into chamber 402 and disposed on a chuck 412, which acts as the bottom electrode and is preferably biased by a radio frequency generator 414 (also typically via a matching network). The RF energy supplied by RF generator 414 controls, in part, the ion energy of the plasma and may have an RF frequency of, for example, 13.56 MHz although other RF frequencies may also be employed. Chuck 412 may represent any suitable work piece holder and may be implemented by, for example, an electrostatic (ESC) chuck, a mechanical-type chuck, a vacuum chuck, and the like. During plasma etching, the pressure within chamber 402 is preferably kept low, e.g., between about 30 and about 60 mTorr in one embodiment.

Figure 5:
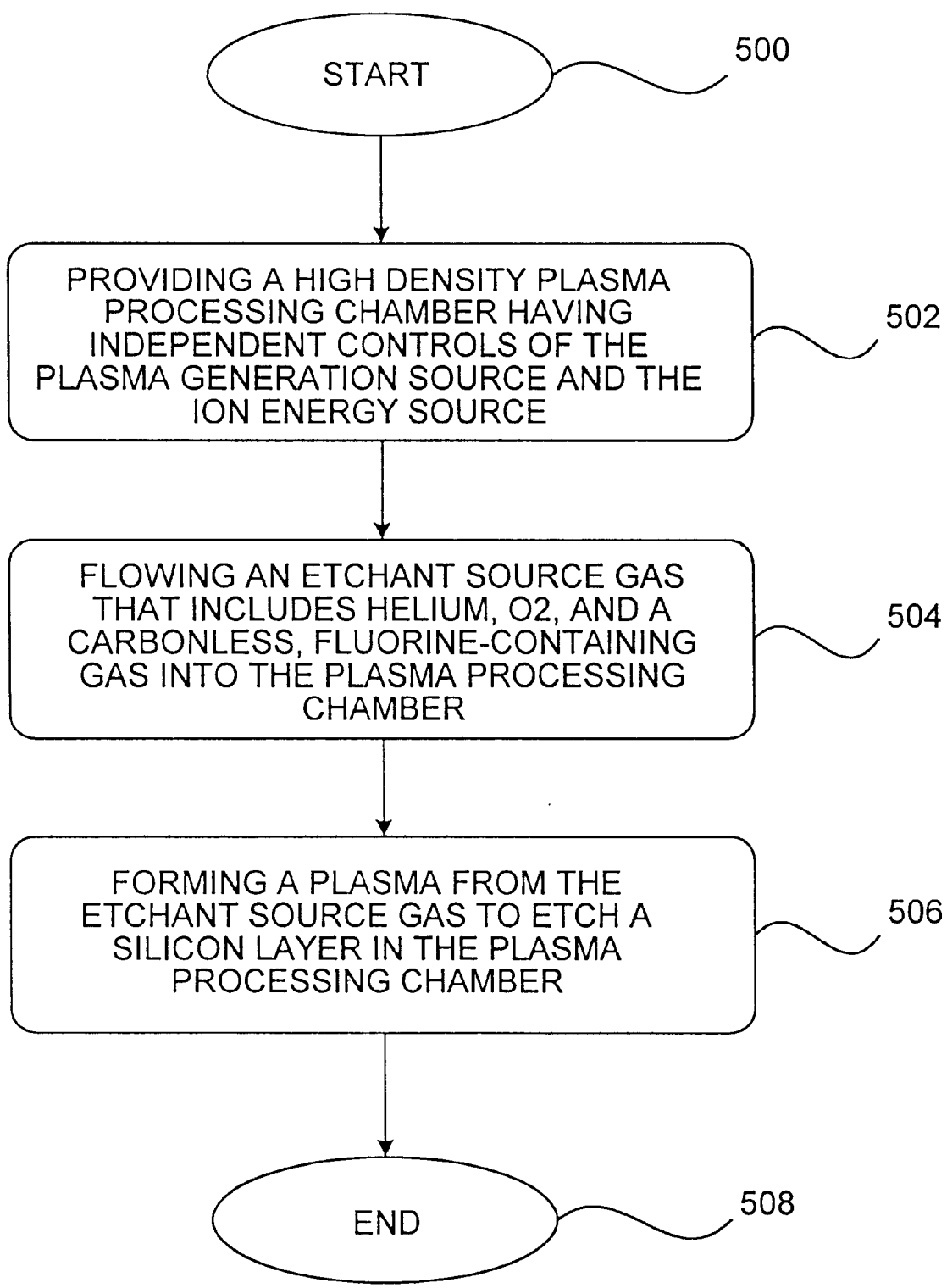
FIG. 5 illustrates, in accordance with one embodiment of the present invention, the process steps involved in forming a trench through a silicon layer of a substrate in a high density plasma processing chamber and employing the helium/$O_2$/carbonless, fluorine-containing gas as an etchant source gas.

FIG. 5 illustrates, in accordance with one embodiment of the present invention, the improved trench etch technique wherein a high helium flow, oxygen/fluorine-based chemistry is employed to etch trenches in a silicon layer in a high density plasma processing chamber.

In step 502, a high density plasma processing system having a plasma processing chamber is provided. As mentioned, high density plasma processing systems refer to plasma processing systems wherein plasma having an ion density greater than about $10^{11}/10^{12}$ ions per cm$^3$ is generated for etching. In contrast, medium or low density plasma processing systems tend to generate plasma having a plasma density below about $10^{11}$ ions per cm$^3$. Preferably, the high density plasma processing system of step 502 permits independent control of the plasma generation source and the ion energy source to control the plasma density and the plasma ion energy independently. In step 504, an etchant source gas that includes $O_2$, helium and a carbonless fluorine-containing gas (i.e., a fluorine-containing gas that does not also contain carbon) is flowed into the plasma processing chamber. Preferably, the carbonless fluorine-containing gas of step 504 is $SF_6$ and/or $NF_3$.

In step 506, a plasma is struck from the etchant source gas provided in step 504. The etchant source gas is then utilized to etch trenches in the silicon layer of the substrate (step 508). As mentioned earlier, the silicon layer may represent a monocrystal silicon layer The etch is terminated when the desired trench depth is reached, either after a predefined time period or by monitoring the trench depth during etching.

In the following example, it is contemplated that the following parameters may be suitable for etching a six-inch monocrystal silicon wafer having thereon a hard mask about 0.5 micron thick. Furthermore, the approximate parameters described below are suitable for this exemplary etch in the aforementioned TCP™ 9400 SE plasma processing system with gas ring dielectric. It should be kept in mind, however, that the invention is not so limiting, and that optimization of the parameters and techniques disclosed herein to suit the particular requirements of a specific plasma processing system and/or substrate is within the skills of those skilled in the art.

In this example, the trenches to be etched has a trench opening of about 0.15 micron to 2 microns and etched to a depth of about 1 to 15 microns. The etch is performed with a relatively high flow volume of helium in a high density plasma processing chamber that permits independent controls of the plasma generation source and the ion energy source.

In the exemplary etch, the ratio of helium flow to the total flow volume is between about 65 percent and about 90 percent, more preferably between about 70 percent and about 85 percent, and preferably at about 75 percent. The ratio of $SF_6$ flow to $O_2$ flow is another important parameter and is between about 0.8 and about 2.0, preferably between about 1 and about 1.6, and preferably at about 1.3. The ratio of oxygen flow to the total flow volume is between about 5 percent and about 20 percent, preferably between about 8 percent and about 15 percent and preferably at about 10 percent. The ratio of $SF_6$ flow to the total flow volume is between about 8 percent and about 30 percent, more preferably between about 10 percent and about 20 percent and preferably at about 15 percent.

In this exemplary etch, the total flow in standard cubic centimeters per minute (sccm) is between about 40 sccm and about 600 sccm, more preferably between about 60 sccm and about 300 sccm, and preferably at about 100 sccm. One skilled in the art will recognize, however, that the total flow depends on the size of the substrate to be processed, as well as the chamber design and other trade-off considerations. The bottom power is between about 10 watts to about 50 watts, more preferably between about 15 watts and about 40 watts and preferably at about 30 watts. The pressure within the plasma processing chamber is between about 30 milli- Torr (mT) and about 120 mT, more preferably between about 40 mT and about 90 mT and preferably about 60 mT. The temperature of the chuck is between about negative 30° C. and about 80° C., more preferably between 0° C. and about 50° C., and preferably at about 20° C. Note that temperature and $O_2$ flow may be balanced against one another since lowering the temperature tends to increase the passivation rate, which may be compensated for by decreasing the flow of oxygen so that the etch process does not shut down due to an excessive amount of passivation at the bottom of the trench. The top (TCP) power is between about 300 watts and about 800 watts, more preferably between about 400 watts and about 600 watts, and preferably at about 500 watts. The duration of the etch varies depending on the etch depth. By way of example, for trenches about 15 microns deep, the etch may last, in one example, up to 8 minutes.

It is observed that the etch rate is substantially improved when the high helium flow, oxygen/fluorine-based chemistry of the invention is employed for etching trenches in a silicon layer in a high density plasma processing system. By way of example, etch rates of between 1.5 and 3 microns per minute have been observed in some exemplary etches. In contrast, prior art processes yield etch rates of only about 1 micron per minute. Also, the etch profile and degree of mask undercutting are observed to be within commercially advantageous ranges for producing ICs on a production basis. The aspect ratio dependency of the etch rate is also substantially reduced. With the addition of the high helium flow, the ARDE is observed, in some exemplary etches, to be about 25 percent for trench sizes of 1 micron and 0.5 micron (compared to about 100 percent in the prior art). The inventive etch technique is expected to be suitable for etching modem high density ICs, e.g., those employing trenches up to 8 microns deep and about 30:1 aspect ratio (using 0.25 micron mask). It is contemplated that the invention may also be employed to etch trenches as small as 0.15 microns in opening dimension, or even smaller, and aspect ratios from 1:1 to about 40:1 but may even be employed for etching trenches having an even higher aspect ratio (e.g., about 100:1 or greater).

More importantly, the high etch rate and other commercially acceptable etch results were obtained without having to employ the fluorocarbon-based chemistry, which as mentioned earlier is a fairly "dirty" process and necessitate frequent cleaning of the plasma processing chamber. With fewer chambers cleanings, the substrate throughput is increased, which lowers the production cost of the resultant semiconductor-based devices.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for etching a trench in a monocrystal silicon layer, comprising:
   providing a plasma processing system having a plasma processing chamber, said plasma processing system having a variable plasma generation source and a variable ion energy source, said variable plasma generation source being configured to be controlled independently of said variable ion energy source;
   flowing an etchant source gas that includes O2, helium, and at least one of SF6 and NF3 into said plasma processing chamber;
   energizing both said variable plasma generation source and said variable ion energy source to form a plasma from said etchant source gas; and
   employing said plasma to etch said trench, wherein said plasma has a density that is greater than about $10^{11}$ ions/cm$^3$.

2. The method of claim 1 wherein said variable plasma generation source is an inductive source.

3. The method of claim 2 wherein said inductive source is a coil, said coil being configured to inductively couple with said plasma when supplied with RF energy.

4. The method of claim 1 wherein the ion density of said plasma is greater than about $10^{12}$ ions/cm$^3$.

5. The method of claim 1 wherein a flow rate of said helium is greater than about 65% of the total flow rate of said etchant source gas.

6. The method of claim 1 wherein a flow rate of said helium is between about 70% and about 85% of said total flow rate of said etchant source gas.

7. A method for etching a trench in a silicon layer, comprising:
   providing a plasma processing system having a plasma processing chamber, said plasma processing system having a variable plasma generation source and a variable ion energy source, said variable plasma generation source being configured to be controlled independently of said variable ion energy source;
   flowing an etchant source gas that includes $O_2$, helium, and $SF_6$ into said plasma processing chamber, wherein a flow rate of said helium is greater than about 65% of a total flow rate of said etchant source gas;
   energizing both said variable plasma generation source and said variable ion energy source to form a plasma from said etchant source gas; and
   employing said plasma to etch said trench.

8. The method of claim 7 wherein said variable plasma generation source is an inductive source.

9. The method of claim 7 wherein the ion density of said plasma is greater than about $10^{11}$ ions/cm$^3$.

10. A method for etching a monocrystal silicon layer, said monocrystal layer being disposed on a substrate, comprising:
    providing a high density plasma processing system having a plasma processing chamber, said plasma processing system having a variable plasma generation source and a variable ion energy source, said variable plasma generation source being configured to be controlled independently of said variable ion energy source;
    flowing an etchant source gas that includes $O_2$, helium, and at least one of $SF_6$ and $NF_3$ into said plasma processing chamber, wherein a flow rate of said helium is greater than about 65% of a total flow rate of said etchant source gas;
    energizing both said variable plasma generation source and said variable ion energy source to form a plasma from said etchant source gas, wherein said plasma has an ion density greater than about $10^{11}$ ions/cm$^3$; and
    employing said plasma to etch said monocrystal silicon layer.

11. The method of claim 10 wherein said flow rate of said helium is between about 70% and about 85% of said total flow rate of said etchant source gas.

12. The method of claim 10 wherein said flow rate of said helium is between about 75% of said total flow rate of said etchant source gas.

13. The method of claim 10 wherein the variable plasma generation source is an inductive source.

14. The method of claim 10 wherein the variable ion energy source is a bottom electrode coupled to receive power from an RF generator, said substrate being disposed above said bottom electrode.

15. The method of claim 10 wherein the ratio of $SF_6$ to the flow of $O_2$ is between about 0.8 and about 2.0.

16. The method of claim 10 wherein said ion density of said plasma is greater than about $10^{12}$ ions/cm$^3$.

17. The method of claim 10 wherein the pressure within said plasma processing chamber is between about 30 mTorr to about 60 mTorr during said etch.

18. A method for etching a monocrystal silicon layer, said monocrystal layer being disposed on a substrate, comprising:

providing a high density plasma processing system having a plasma processing chamber, said plasma processing system having a variable plasma generation source and a variable ion energy source, said variable plasma generation source being configured to be controlled independently of said variable ion energy source;

flowing an etchant source gas that includes $O_2$, helium, and $NF_3$ into said plasma processing chamber, wherein a flow rate of said helium is greater than about 65% of a total flow rate of said etchant source gas;

energizing both said variable plasma generation source and said variable ion energy source to form a plasma from said etchant source gas, wherein said plasma has an ion density greater than about $10^{11}$ ions/cm$^3$; and employing said plasma to etch said monocrystal silicon layer.

* * * * *